US012633899B2

(12) United States Patent
Kondo et al.

(10) Patent No.: US 12,633,899 B2
(45) Date of Patent: May 19, 2026

(54) RESONATOR AND FILTER DEVICE

(71) Applicant: Murata Manufacturing Co., Ltd.,
Nagaokakyo (JP)

(72) Inventors: Seima Kondo, Nagaokakyo (JP);
Takayuki Okude, Nagaokakyo (JP)

(73) Assignee: MURATA MANUFACTURING CO.,
LTD., Kyoto (JP)

( * ) Notice: Subject to any disclaimer, the term of this
patent is extended or adjusted under 35
U.S.C. 154(b) by 140 days.

(21) Appl. No.: 18/603,327

(22) Filed: Mar. 13, 2024

(65) Prior Publication Data

US 2024/0333253 A1      Oct. 3, 2024

(30) Foreign Application Priority Data

Mar. 28, 2023   (JP) ................................. 2023-051275

(51) Int. Cl.
H03H 9/17 (2006.01)
H03H 9/135 (2006.01)
H03H 9/56 (2006.01)

(52) U.S. Cl.
CPC .............. H03H 9/17 (2013.01); H03H 9/135
(2013.01); H03H 9/568 (2013.01)

(58) Field of Classification Search
CPC .......... H03H 9/17; H03H 9/135; H03H 9/568;
H03H 9/6483; H03H 9/25; H03H
9/02543; H03H 9/02724; H03H 9/64

USPC .................................................. 333/193–196
See application file for complete search history.

(56) References Cited

U.S. PATENT DOCUMENTS

| | | | |
|---|---|---|---|
| 2018/0294797 A1 | 10/2018 | Ozasa | |
| 2019/0379354 A1 | 12/2019 | Yasuda | |
| 2020/0304102 A1* | 9/2020 | Kanazawa | H03H 9/725 |

FOREIGN PATENT DOCUMENTS

| | | |
|---|---|---|
| WO | 2017/115870 A1 | 7/2017 |
| WO | 2018/159111 A1 | 9/2018 |

* cited by examiner

Primary Examiner — Jorge L Salazar, Jr.
(74) Attorney, Agent, or Firm — Keating & Bennett, LLP

(57)      ABSTRACT

A resonator includes a resonant electrode on a substrate
having piezoelectricity. The resonant electrode includes a
first comb-shaped electrode including a first busbar elec-
trode and first electrode fingers, and a second comb-shaped
electrode including a second busbar electrode and second
electrode fingers. The substrate includes first and second
overlap regions. The first region includes of pairs of first and
second electrode fingers arranged alternately at a first pitch.
The second region includes pairs of first and second elec-
trode fingers arranged alternately at a second pitch different
from the first pitch. An electrostatic capacitance of the first
comb-shaped electrode and the second comb-shaped elec-
trode in the first region is about 0.9 times or more and about
1.1 times or less an electrostatic capacitance of the first
comb-shaped electrode and the second comb-shaped elec-
trode in the second region.

20 Claims, 5 Drawing Sheets

RESONATOR AND FILTER DEVICE

CROSS REFERENCE TO RELATED APPLICATIONS

This application claims the benefit of priority to Japanese Patent Application No. 2023-051275 filed on Mar. 28, 2023. The entire contents of this application are hereby incorporated herein by reference.

BACKGROUND OF THE INVENTION

1. Field of the Invention

The present invention relates to resonators and filter devices.

2. Description of the Related Art

A filter in the related art includes a plurality of surface acoustic wave devices having a piezoelectric substrate and interdigital transducer (IDT) electrodes formed on the piezoelectric substrate (for example, see International Publication No. 2018/159111 and International Publication No. 2017/115870).

Excessive external power supplied to or a large electric charge applied the to filter described in International Publication No. 2018/159111 or International Publication No. 2017/115870 can destroy the filter.

If the filter is destroyed under severe test conditions that deviate from appropriate operating conditions, it is difficult with techniques in the related art to estimate the power supplied or charge applied at the time of destruction from the destroyed filter.

SUMMARY OF THE INVENTION

Example embodiments of the present invention provide resonators and filter devices that each enable quantitative determination of the cause of destruction from a destroyed resonator.

A resonator according to an example embodiment of the present invention includes a substrate having piezoelectricity, and a resonant electrode on the substrate. The resonant electrode includes a first busbar electrode and a second busbar electrode facing each other, a plurality of first electrode fingers extending in a comb shape from the first busbar electrode toward the second busbar electrode, and a plurality of second electrode fingers extending in a comb shape from the second busbar electrode toward the first busbar electrode such that the plurality of first electrode fingers and the plurality of second electrode fingers are alternately arranged in a first direction. A first comb-shaped electrode includes the 1 busbar electrode and the plurality of first electrode fingers. A second comb-shaped electrode includes the second busbar electrode and the plurality of second electrode fingers. The substrate includes an overlap region where the plurality of first electrode fingers and the plurality of second electrode fingers overlap when the substrate is viewed in the first direction. The overlap region includes a first region including a plurality of pairs of the first electrode fingers and the second electrode fingers alternately arranged in the first direction at a first pitch, and a second region including a plurality of pairs of the first electrode fingers and the second electrode fingers alternately arranged in the first direction at a second pitch different from the first pitch. An electrostatic capacitance of the first comb-shaped electrode and the second comb-shaped electrode in the first region is about 0.9 times or more and about 1.1 times or less an electrostatic capacitance of the first comb-shaped electrode and the second comb-shaped electrode in the second region.

A resonator according to an example embodiment of the present invention includes a substrate having piezoelectricity, and a resonant electrode on the substrate. The resonant electrode includes a first busbar electrode and a second busbar electrode facing each other, a plurality of first electrode fingers extending in a comb shape from the first busbar electrode toward the second busbar electrode, and a plurality of second electrode fingers extending in a comb shape from the second busbar electrode toward the first busbar electrode such that the plurality of first electrode fingers and the plurality of second electrode fingers are alternately arranged in a first direction. A first comb-shaped electrode includes the first busbar electrode and the plurality of first electrode fingers. A second comb-shaped electrode includes the second busbar electrode and the plurality of second electrode fingers. The substrate includes an overlap region where the plurality of first electrode fingers and the plurality of second electrode fingers overlap when the substrate is viewed in the first direction. The overlap region includes a first region including J pairs of the first electrode fingers and the second electrode fingers alternately arranged in the first direction at a first pitch with a first gap, where J is an integer of two or more, and a second region including K pairs of the first electrode fingers and the second electrode fingers alternately arranged in the first direction at a second pitch different from the first pitch with a second gap, where K is an integer of two or more. A first value obtained by dividing the first pitch by the first gap is about 0.9 times or more and about 1.1 times or less a second value obtained by dividing the second pitch by the second gap.

According to example embodiments of the present invention, it is possible to provide resonators and filter devices that each enable quantitative determination of the cause of destruction from a destroyed resonator.

The above and other elements, features, steps, characteristics and advantages of the present invention will become more apparent from the following detailed description of the example embodiments with reference to the attached drawings.

BRIEF DESCRIPTION OF THE DRAWINGS

FIG. 4 is a diagram for illustrating how to determine an electrostatic capacitance Ca between comb-shaped electrodes 71a and 71b in a region 21a.

DETAILED DESCRIPTION OF THE EXAMPLE EMBODIMENTS

Figure 1:
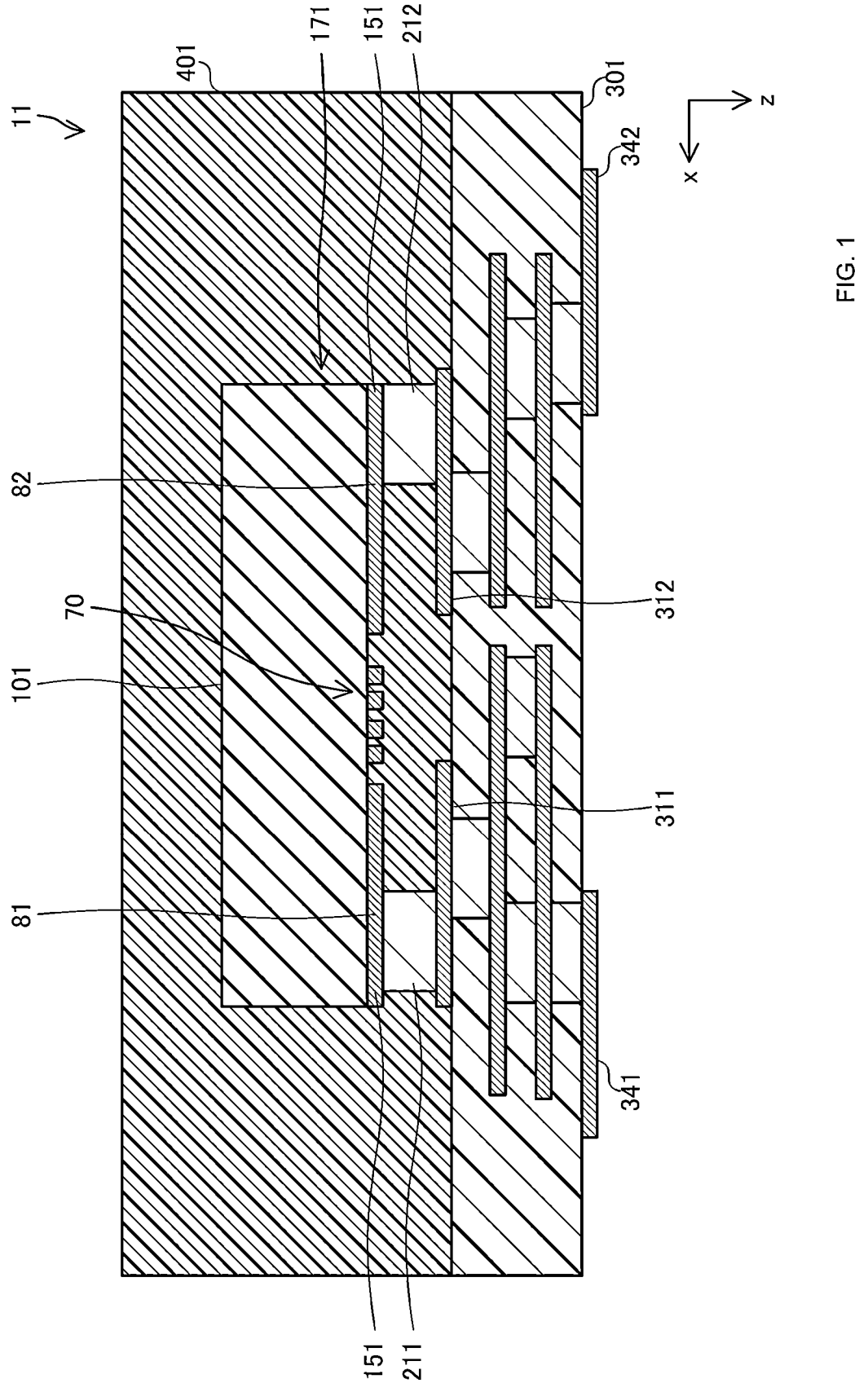
FIG. 1 is a diagram schematically illustrating a section of a filter device 11 according to an example embodiment of the present invention parallel to a zx plane.

Hereinafter, example embodiments of the present invention will be described in detail with reference to the drawings. The same or corresponding elements are assigned the same reference numerals, and redundant descriptions are omitted as much as possible.

FIG. 1 is a diagram schematically illustrating a section of a filter device 11 according to an example embodiment of the present invention parallel to a zx plane. An x-axis, a y-axis, and a z-axis may be illustrated in each drawing. The x-axis, the y-axis, and the z-axis form three-dimensional Cartesian coordinates of the right-hand system. Hereinafter, an arrow direction of the x-axis is referred to as the x-axis positive side and the opposite direction of the arrow is referred to as the x-axis negative side in some cases, and the same applies to the other axes. The z-axis positive side and the z-axis negative side are respectively referred to as "upper side" and "lower side" in some cases. A plane orthogonal or substantially orthogonal to the x-axis, the y-axis, or the z-axis is referred to as a yz plane, a zx plane, or an xy plane in some cases.

As illustrated in FIG. 1, the filter device 11 includes an acoustic wave device 171, a printed circuit board 301, and a sealant 401. The acoustic wave device 171 includes a piezoelectric substrate 101 and a wiring layer 151. The filter device 11 may include, for example, a ceramic substrate instead of the printed circuit board 301.

The wiring layer 151 is provided on the upper side (z-axis positive side) of the piezoelectric substrate 101. By patterning the wiring layer 151, an IDT electrode 70 and wiring electrodes 81 and 82 are provided.

The wiring electrode 81 is electrically connected to a wiring electrode 311 provided on a lower (z-axis negative side) surface of the printed circuit board 301 through a bump 211. The wiring electrode 311 is electrically connected to a substrate ground terminal 341 provided on an upper surface of the printed circuit board 301 through vias and internal wiring electrodes.

The wiring electrode 82 is electrically connected to a wiring electrode 312 provided on the lower surface of the printed circuit board 301 through a bump 212. The wiring electrode 312 is electrically connected to a substrate input terminal 342 provided on the upper surface of the printed circuit board 301 through vias and internal wiring electrodes.

The terminals to which the wiring electrodes 311 and 312 are connected are not limited to the substrate ground terminal 341 and the substrate input terminal 342. For example, the wiring electrode 312 may be electrically connected to a substrate output terminal (not illustrated) on the upper side of the printed circuit board 301 through vias and internal wiring electrodes.

The acoustic wave device 171, the bumps 211 and 212, and the lower surface of the printed circuit board 301 are covered with the sealant 401. The sealant 401 is, for example, a mold resin layer.

Figure 2:
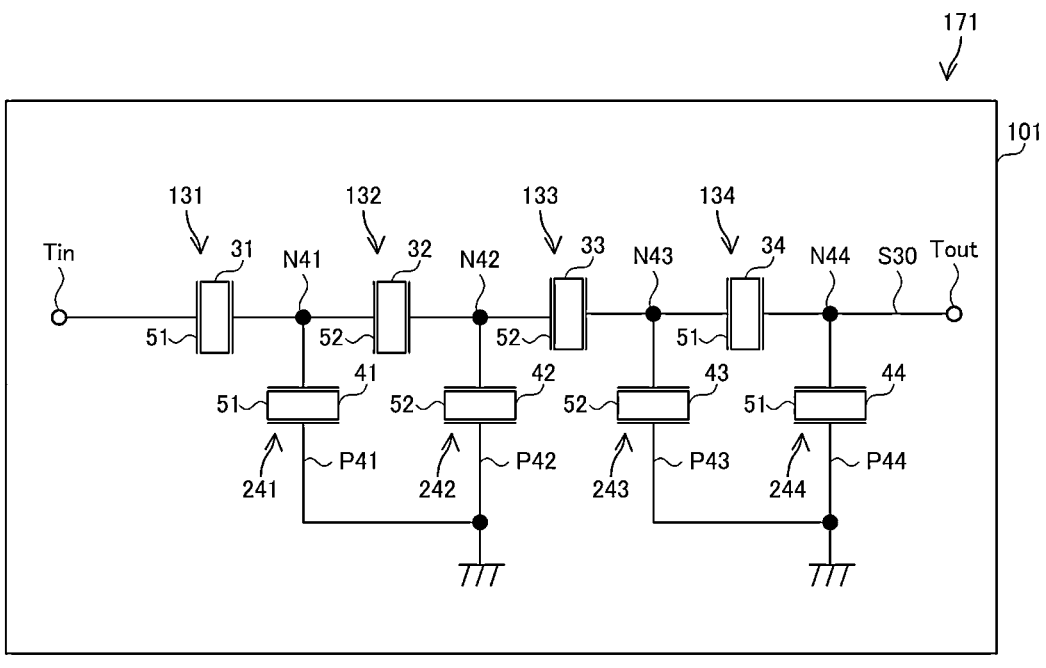
FIG. 2 is a diagram illustrating a circuit configuration of the filter device 11.

FIG. 2 is a diagram illustrating a circuit configuration of the filter device 11. As illustrated in FIG. 2, the filter device 11 includes a series line S30, parallel lines P41, P42, P43, and P44, series arm resonators 131, 132, 133, and 134, and parallel arm resonators 241, 242, 243, and 244.

The filter device 11 is, for example, a ladder filter. In the present example embodiment, for example, the filter device 11 is a band pass filter that passes a frequency component of a radio frequency signal in a predetermined frequency band (pass band) when the radio frequency signal is transmitted from an input terminal Tin to an output terminal Tout. the filter device 11 similarly defines and functions as a band pass filter when a radio frequency signal is transmitted from the output terminal Tout to the input terminal Tin. The filter device 11 may be, for example, a band elimination filter that attenuates a frequency component of a radio frequency signal in a predetermined frequency band (stop band).

The piezoelectric substrate 101 in the filter device 11 is a substrate that has piezoelectricity and includes a main surface parallel or substantially parallel to the xy plane. In the present example embodiment, the piezoelectric substrate 101 is made of, for example, lithium niobate or lithium tantalate. The piezoelectric substrate 101 may partially have piezoelectricity. Specifically, the piezoelectric substrate 101 may include, for example, a multilayer body including a supporting substrate, a piezoelectric thin film (piezoelectric body) provided on a surface, a film having an acoustic velocity different from that of the piezoelectric thin film, and the like.

The series line S30 and the parallel lines P41, P42, P43, and P44 are provided on the main surface of the piezoelectric substrate 101. The series line S30 is, for example, a transmission line that passes radio frequency signals, and connects the input terminal Tin and the output terminal Tout. Resonant electrodes 31, 32, 33, and 34 are provided in the series line S30. In the present example embodiment, in the series line S30, the resonant electrodes 31, 32, 33, and 34 are disposed in the order of increasing distance from the input terminal Tin.

Specifically, the resonant electrode 31 includes a first end connected to the input terminal Tin and a second end. The resonant electrode 32 includes a first end connected to the second end of the resonant electrode 31 and a second end. The resonant electrode 33 includes a first end connected to the second end of the resonant electrode 32 and a second end. The resonant electrode 34 includes a first end connected to the second end of the resonant electrode 33 and a second end connected to the output terminal Tout.

Each of the parallel lines P41, P42, P43, and P44 is, for example, a transmission line that passes radio frequency signals, and branches from the series line S30. In the present example embodiment, the parallel line P41 branches at a node N41 located between the resonant electrode 31 and the resonant electrode 32 in the series line S30. The parallel line P42 branches at a node N42 located between the resonant electrode 32 and the resonant electrode 33 in the series line S30. The parallel line P43 branches at a node N43 located between the resonant electrode 33 and the resonant electrode 34 in the series line S30. The parallel line P44 branches at a node N44 located between the resonant electrode 34 and the output terminal Tout in the series line S30.

Resonant electrodes 41, 42, 43, and 44 are provided in the parallel lines P41, P42, P43, and P44, respectively. In the present example embodiment, the resonant electrode 41 includes a first end connected to the node N41 and a second end connected to the ground. The resonant electrode 42 includes a first end connected to the node N42 and a second type connected to the ground. The resonant electrode 43 includes a first end connected to the node N43 and a second end connected to the ground. The resonant electrode 44 includes a first end connected to the node N44 and a second end connected to the ground.

The resonant electrodes 31, 32, 33, and 34 provided on the main surface of the piezoelectric substrate 101 define and function as the series arm resonators 131, 132, 133, and 134, respectively.

The resonant electrodes 41, 42, 43, and 44 provided on the main surface of the piezoelectric substrate 101 define and function as the parallel arm resonators 241, 242, 243, and 244, respectively.

The series arm resonators 131 and 134 and the parallel arm resonators 241 and 244 closest to the input terminal Tin or the output terminal Tout are resonators 51 for providing a determination. The series arm resonators 132 and 133 and the parallel arm resonators 242 and 243 are normal resonators 52. Details of the resonators 51 and 52 will be described later.

Some of the series arm resonators 131 and 134 and the parallel arm resonators 241 and 244 closest to the input terminal Tin or the output terminal Tout may include the resonator 51.

Figure 3:
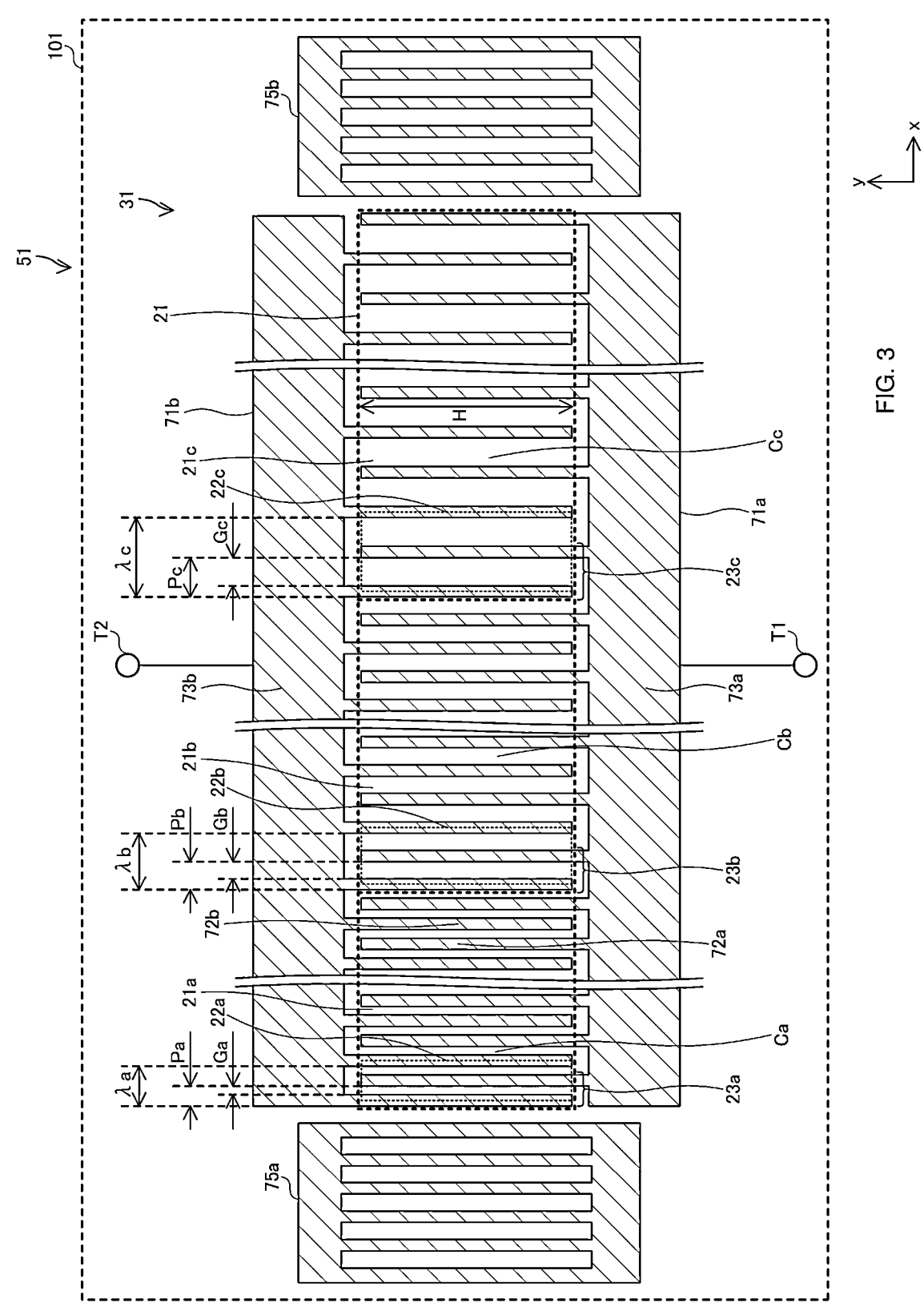
FIG. 3 is a schematic diagram illustrating an overview of a resonator 51 according to an example embodiment of the present invention.

FIG. 3 is a schematic diagram illustrating an overview of the resonator 51. FIG. 3 is a plan view and illustrates, as an example of the resonator 51, the resonant electrode 31 included in the series arm resonator 131 and the piezoelectric substrate 101 as viewed from above.

While FIG. 3 illustrates an example for describing a typical structure of the resonator 51, the shape, size, and orientation of the resonator 51 are not limited to those of this example. The resonant electrode 34 included in the series arm resonator 134 and the resonant electrodes 41 and 44 respectively included in the parallel arm resonators 241 and 244 also have the same or substantially the same configuration as the resonant electrode 31.

As illustrated in FIG. 3, the resonant electrode 31 and the piezoelectric substrate 101 define and function as a surface acoustic wave resonator. The resonant electrode 31 includes comb-shaped electrodes 71a and 71b and reflectors 75a and 75b.

The comb-shaped electrode 71a includes a plurality of electrode fingers 72a (first electrode finger) and a busbar electrode 73a (first busbar electrode). The comb-shaped electrode 71b includes a plurality of electrode fingers 72b (second electrode finger) and a busbar electrode 73b (second busbar electrode. Hereinafter, each of the electrode fingers 72a and 72b is referred to as an electrode finger 72 in some cases.

The busbar electrode 73a is connected to a first terminal T1 and extends in an x-axis direction (first direction). In the present example embodiment, the busbar electrode 73a is a rectangular or substantially rectangular electrode with major and minor axes parallel or substantially parallel to the x- and y-axes, respectively.

The busbar electrode 73b is located on the y-axis positive side of the busbar electrode 73a. The busbar electrode 73b is connected to a second terminal T2 and extends in the x-axis direction. The busbar electrode 73b faces the busbar electrode 73a in a y-axis direction (second direction).

In the present example embodiment, the busbar electrode 73b is an electrode having the same or substantially the same shape as the busbar electrode 73a. The x-axis positive side edge of the busbar electrode 73a and the x-axis positive side edge of the busbar electrode 73b are aligned. The x-axis negative side edge of the busbar electrode 73a and the x-axis negative side edge of the busbar electrode 73b are aligned.

The plurality of electrode fingers 72a extend from the busbar electrode 73a in a comb shape from the busbar electrode 73a toward the busbar electrode 73b. In the present example embodiment, the plurality of electrode fingers 72a are rectangular or substantially rectangular electrodes extending parallel or substantially parallel to the y-axis from the y-axis positive side edge of the busbar electrode 73a to the y-axis positive side.

The y-axis direction lengths of the plurality of electrode fingers 72a are the same or substantially the same. The x-axis direction widths of the plurality of electrode fingers 72a are the same or substantially the same. The y-axis direction lengths of the plurality of electrode fingers 72a need not be the same or substantially the same. The x-axis direction widths of the plurality of electrode fingers 72a need not be the same or substantially the same.

The plurality of electrode fingers 72b extend in a comb shape from the busbar electrode 73b toward the busbar electrode 73a. The plurality of electrode fingers 72b are provided such that the electrode fingers 72a and 72b are alternately arranged in the x-axis direction.

In the present example embodiment, the plurality of electrode fingers 72b are rectangular or substantially rectangular electrodes extending parallel or substantially parallel to the y-axis from the y-axis negative side edge of the busbar electrode 73b to the y-axis negative side.

The y-axis direction lengths of the plurality of electrode fingers 72b are the same or substantially the same. Specifically, the y-axis direction length of the electrode finger 72b is the same or substantially the same as the y-axis direction length of the electrode finger 72a. The x-axis direction widths of the plurality of electrode fingers 72a are the same or substantially the same. Specifically, the x-axis direction width of the electrode finger 72b is the same or substantially the same as the x-axis direction width of the electrode finger 72a. The y-axis direction lengths of the plurality of electrode fingers 72b need not be the same or substantially the same. The x-axis direction widths of the plurality of electrode fingers 72b need not be the same or substantially the same.

The piezoelectric substrate 101 includes an overlap region 21 where the electrode fingers 72a and 72b overlap when the piezoelectric substrate 101 is viewed in the x-axis direction. The y-axis positive side edge of the overlap region 21 overlaps the y-axis positive side tips of the plurality of electrode fingers 72a. The y-axis negative side edge of the overlap region 21 overlaps the y-axis negative side tips of the plurality of electrode fingers 72b. The overlap region 21 includes a plurality of regions with different pitches (or periods).

The pitch is, for example, the sum of the x-axis direction width of the electrode finger 72b and the spacing, i.e., the gap, between the electrode fingers 72b and 72a. In other words, the pitch is the distance between the centers of adjacent and opposing electrode fingers 72a and 72b. The pitch may be the sum of the x-axis direction width of the electrode finger 72a and the spacing, i.e., the gap, between the electrode fingers 72a and 72b.

In the present example embodiment, the overlap region 21 includes, for example, regions 21a (first region), 21b (second region), and 21c. The regions 21a, 21b, and 21c are located in this order from the x-axis negative side to the x-axis positive side. Each of the regions 21a, 21b, and 21c is a region where the electrode fingers 72a and 72b, arranged at the same or substantially the same pitch (or period), overlap when viewed in in the x-axis direction.

In the region 21a, the electrode fingers 72a and 72b are alternately arranged in the x-axis direction at a pitch Pa (first pitch) with a gap Ga (first gap), and J (J is an integer of two or more) pairs 23a of electrode fingers 72a and 72b are included.

That is, in the region 21a, the pairs 23a are arranged repeatedly in the x-axis direction with a spacing of twice the pitch Pa, i.e., a wavelength λa.

The region 21a includes a plurality of unit regions 22a. The unit region 22a has, for example, a rectangular or substantially rectangular shape including a long side parallel or substantially parallel to the y-axis direction and a short side parallel or substantially parallel to the x-axis direction.

The length of the long side of the unit region 22a (hereinafter sometimes referred to as height H) is the distance between a line connecting end portions of the plurality of electrode fingers 72a on the y-axis positive side and a line connecting end portions of the plurality of electrode fingers 72b on the y-axis negative side.

The length of the short side of the unit region 22a is, for example, the distance between the centers of two electrode fingers 72b facing each other across the electrode finger 72a. The length of the short side of the unit region 22a may be the distance between the centers of two electrode fingers 72a facing each other across the electrode finger 72b. In any of these cases, the length of the short side of the unit region 22a is the wavelength λa.

In the region 21b, the electrode fingers 72a and 72b are alternately arranged in the x-axis direction at a pitch Pb (second pitch) different from the pitch Pa with a gap Gb (second gap), and K (K is an integer of two or more) pairs 23b of electrode fingers 72a and 72b are included.

That is, in the region 21b, the pairs 23b of the electrode fingers 72a and 72b are arranged repeatedly in the x-axis direction with a spacing of twice the pitch Pb, i.e., a wavelength λb.

The region 21b includes a plurality of unit regions 22b. The unit region 22b has a rectangular or substantially rectangular shape similarly to the unit region 22a. The length of a long side and the length of a short side of a unit region 22c are the height H and the wavelength λb, respectively.

In the region 21c, the electrode fingers 72a and 72b are alternately arranged in the x-axis direction at a pitch Pc different from the pitches Pa and Pb with a gap Gc, and L (L is an integer of two or more) pairs 23c of electrode fingers 72a and 72b are included.

That is, in the region 21c, the pairs 23c of the electrode fingers 72a and 72b are arranged repeatedly in the x-axis direction with a spacing of twice the pitch Pc, i.e., a wavelength λc.

The region 21c includes a plurality of unit regions 22c. The unit region 22c has a rectangular or substantially rectangular shape similarly to the unit region 22a. The length of a long side and the length of a short side of the unit region 22c are the height H and the wavelength λc, respectively.

Figure 4:
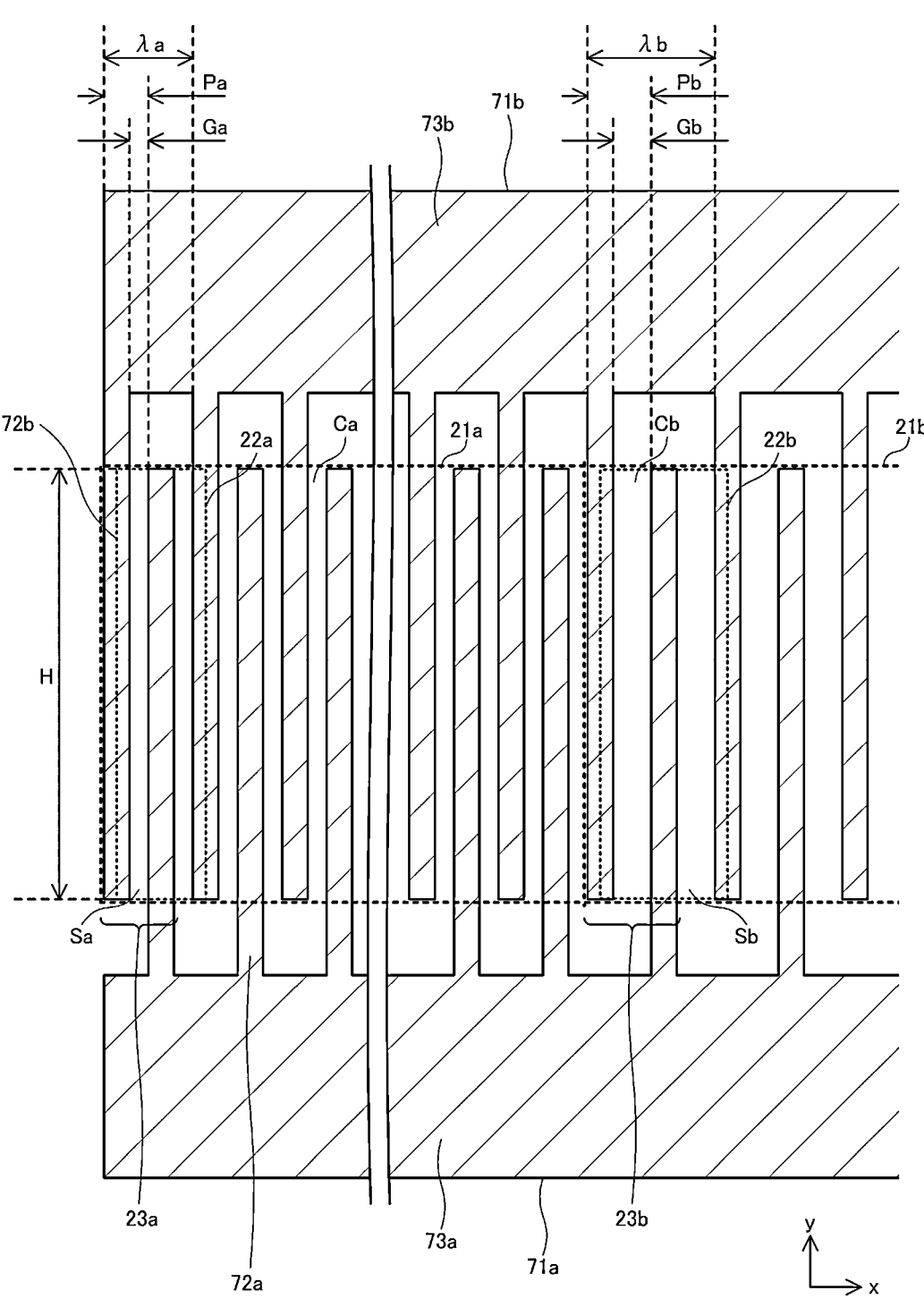

FIG. 4 is a diagram for illustrating how to determine an electrostatic capacitance Ca between the comb-shaped electrodes 71a and 71b in the region 21a. FIG. 4 illustrates an enlarged view around the region 21a.

As illustrated in FIGS. 3 and 4, the electrostatic capacitance Ca between the comb-shaped electrodes 71a and 71b in the region 21a can be approximated by a value obtained by dividing a value obtained by multiplying a predetermined number ε by an area Sa of the unit region 22a in the region 21a and a number Ma of the unit regions 22a included in the region 21a by the gap Ga of the region 21a.

Here, the predetermined number ε is a numeric value based on the physical properties of the material located between and around the electrode fingers 72a and 72b and is, for example, the dielectric constant. The predetermined number ε is the same or substantially the same value in each region. The number Ma can be approximated by the number J of pairs 23a in the region 21a. The area Sa of the unit region 22a is the product of the wavelength λa which is the x-axis direction length of the unit region 22a, i.e., twice the pitch Pa, and the height H which is the y-axis direction length of the region 21a. The gap Ga is the distance between opposing edges between adjacent electrode fingers 72a and 72b in the region 21a.

That is, the electrostatic capacitance Ca between the comb-shaped electrodes 71a and 71b in the region 21a can be expressed approximately as $Ca=\varepsilon\times2\times Pa\times H\times J/Ga=\varepsilon\times2\times Va\times H\times J$. Here, the value Va (first value) is Pa/Ga.

Similarly to the electrostatic capacitance Ca, an electrostatic capacitance Cb between the comb-shaped electrodes 71a and 71b in the region 21b can be approximated by a value obtained by dividing a value obtained by multiplying the predetermined number ε by an area Sb of the unit region 22b in the region 21b and a number Mb of the unit regions 22b included in the region 21b by the gap Gb of the region 21b.

Specifically, the electrostatic capacitance Cb can be expressed as $Cb=\varepsilon\times Sb\times Mb/GB=\varepsilon\times2\times Pb\times H\times Mb/GB\approx\varepsilon\times2\times Vb\times H\times K$. Here, the value Vb (second value) is Pb/Gb.

Similarly to the electrostatic capacities Ca and Cb, an electrostatic capacitance Cc between the comb-shaped electrodes 71a and 71b in the region 21c can be expressed approximately as $Cc=\varepsilon\times2\times Vc\times H\times K$. Here, Vc is Pc/Gc.

For example, J×Va is about 0.9 times or more and about 1.1 times or less K×Vb. That is, $K\times Vb\times0.9\leq J\times Va\leq K\times Vb\times1.1$. Multiplying each term in this equation by ε×2×H yields $\varepsilon\times2\times H\times K\times Vb\times0.9\leq\varepsilon\times2\times H\times J\times Va\leq\varepsilon\times2\times H\times K\times Vb\times1.1$. This equation can be approximated as $Cb\times0.9\leq Ca\leq Cb\times1.1$. That is, the electrostatic capacitance Ca is about 0.9 times or more and about 1.1 times or less the electrostatic capacitance Cb. Preferably, J×Va is about 0.95 times or more and about 1.05 times or less K×Vb.

For example, K×Vb is about 0.9 times or more and about 1.1 times or less L×Vc. That is, the electrostatic capacitance Cb is about 0.9 times or more and about 1.1 times or less the electrostatic capacitance Cc. Preferably, K×Vb is about 0.95 times or more and about 1.05 times or less L×Vc.

J×Va may be about 0.9 times or more and about 1.1 times or less L×Vc. That is, the electrostatic capacitance Ca may be about 0.9 times or more and about 1.1 times or less the electrostatic capacitance Cc. Preferably, J×Va may be about 0.95 times or more and about 1.05 times or less L×Vc.

J×Va, K×Vb, and L×Vc are about 0.9 times or more and about 1.1 times or less the average values of J×Va, K×Vb, and L×Vc, respectively. That is, for example, the electrostatic capacitances Ca, Cb, and Cc are about 0.9 times or more and about 1.1 times or less the average values of electrostatic capacitances Ca, Cb, and Cc, respectively.

Preferably, for example, J×Va, K×Vb, and L×Vc are about 0.95 times or more and about 1.05 times or less the average values of J×Va, K×Vb, and L×Vc, respectively. That is, the electrostatic capacitances Ca, Cb, and Cc are about 0.95 times or more and about 1.05 times or less the average values of the electrostatic capacitances Ca, Cb, and Cc, respectively.

For example, J is about 0.9 times or more and about 1.1 times or less K. For example, K is about 0.9 times or more and about 1.1 times or less L.

Preferably, J is about 0.95 times or more and about 1.05 times or less K. For example, K is about 0.95 times or more and about 1.05 times or less L.

In the present example embodiment, for example, J, K, and L are about 0.9 times or more and about 1.1 times or less the average values of J, K, and L, respectively. Preferably, J, K, and L are about 0.95 times or more and about 1.05 times or less the average values of J, K, and L, respectively.

Moreover, J, K, and L are integers of, for example, five or more. That is, five or more pairs are arranged repeatedly in each region. Specifically, in the region 21*a*, five or more pairs 23*a* are arranged repeatedly. In the region 21*b*, five or more pairs 23*b* are arranged repeatedly. In the region 21*c*, five or more pairs 23*c* are arranged repeatedly.

For example, the repetition pitch Pa of the electrode finger 72 in the region 21*a* is about 0.99 times or more and about 1.01 times or less the repetition pitch Pb of the electrode finger 72 in the region 21*b*. Moreover, the repetition pitch Pb of the electrode finger 72 in the region 21*b* is, for example, about 0.99 times or more and about 1.01 times or less the repetition pitch Pc of the electrode finger 72 in the region 21*c*.

Preferably, for example, the pitch Pa is about 0.995 times or more and about 1.005 times or less the pitch Pb. The pitch Pb is about 0.995 times or more and about 1.005 times or less the pitch Pc.

In the present example embodiment, for example, the repetition pitches Pa, Pb, and Pc of the electrode finger 72 in the respective regions 21*a*, 21*b*, and 21*c* are about 0.99 times or more and about 1.01 times or less the average values of the repetition pitches Pa, Pb, and Pc.

Preferably, the pitches Pa, Pb, and Pc are about 0.995 times or more and about 1.005 times or less the average values.

The larger the pitch, the higher the resistance to externally supplied power or given charge. In the present example embodiment, the pitches Pa, Pb, and Pc are larger in this order. For example, if the externally supplied power or given charge is small, only the region 21*a* is destroyed. On the other hand, if the externally supplied power or given charge is large, the regions 21*a* and 21*b* are destroyed or all of the regions 21*a*, 21*b*, and 21*c* are destroyed.

The reflectors 75*a* and 75*b* include a plurality of electrode fingers parallel or substantially parallel to each other and busbar electrodes connecting the plurality of electrode fingers and are provided at respective ends in an acoustic wave propagation direction of the comb-shaped electrodes 71*a* and 71*b*. The reflectors 75*a* and 75*b* have, for example, the same or substantially the same shape.

Figure 5:
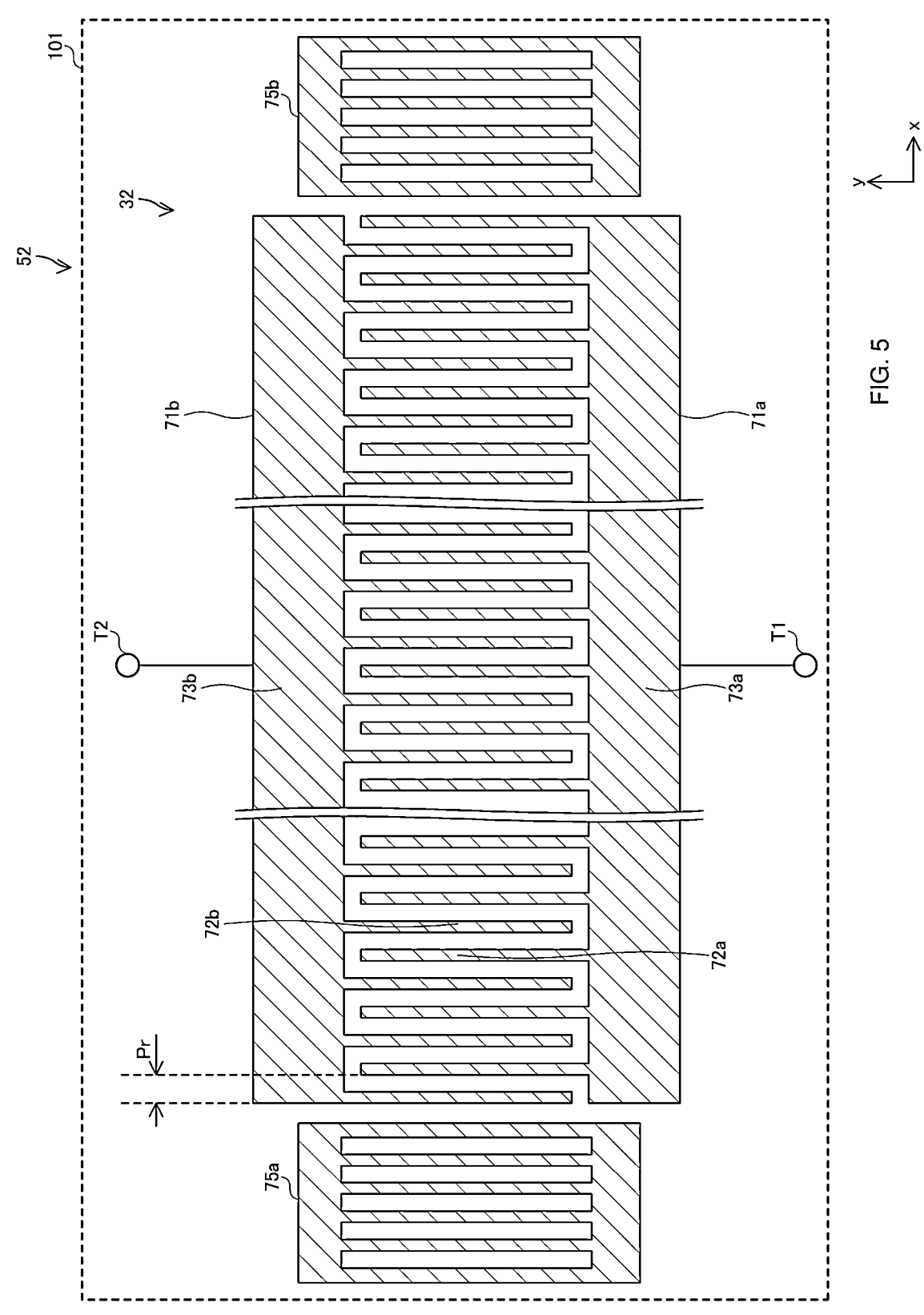
FIG. 5 is a schematic diagram illustrating an overview of a resonator 52 according to an example embodiment of the present invention.

FIG. 5 is a schematic diagram illustrating an overview of the resonator 52. As illustrated in FIG. 5, unlike the resonator 51 for providing determination, the resonator 52 that is normal has a comb-shaped electrode with a constant pitch Pr of the electrode fingers 72 in the resonator 52. In other words, the resonator 52 includes the comb-shaped electrode in which the electrode fingers 72*a* and 72*b* are arranged repeatedly at a single pitch Pr.

While the resonator 51 of the above description includes three regions in which the electrode fingers 72*a* and 72*b* are arranged repeatedly at the same or substantially the same pitch, the present invention is not limited thereto. The resonator 51 may include two, or four or more regions.

In the resonator 51 of the above description, the regions 21*a*, 21*b*, and 21*c* are located in this order toward the x-axis positive side. However, the present invention is not limited thereto. The regions 21*a*, 21*b*, and 21*c* may be located in any order.

While the resonator 51 of the above description includes the regions 21*a*, 21*b*, and 21*c* with different pitches, the present invention is not limited thereto. The resonator 51 may be configured such that two of the three regions have the same or substantially the same pitches. In this case, the two regions having the same or substantially the same pitches are located at respective ends.

In the resonator 51 of the above description, for example, J×Va is about 0.9 times or more and about 1.1 times or less K×Vb. However, the present invention is not limited thereto.

The value Va may be about 0.9 times or more and about 1.1 times or less the value Vb. For example, when J>K, it is possible to satisfy K×Vb×0.9≤K×Va≤K×Vb×1.1 by setting a region including K unit regions 22*a* and a region including K unit regions 22*b*. Thus, the advantageous effects of the present invention can be achieved. In other words, the electrostatic capacitance of the region including K unit regions 22*a* is about 0.9 times or more and about 1.1 times or less the electrostatic capacitance of the region including K unit regions 22*b*. Additionally, when J<K, it is possible to satisfy J×Vb×0.9≤J×Va≤J×Vb×1.1 by setting a region including J unit regions 22*a* and a region including J unit regions 22*b*. Thus, the advantageous effects of the present invention can be achieved. Similarly, the value Vb may be about 0.9 times or more and about 1.1 times or less the value Vc.

While the filter device 11 described above is provided with four parallel lines, example embodiments of the present invention are not limited thereto. The filter device 11 may be provided with one, two, three, five, or more parallel lines.

In the filter device 11 described above, four series arm resonators are provided in the series line S30. However, example embodiments of the present invention are not limited thereto. In the filter device 11, one, two, three, five, or more series arm resonators may be provided in the series line S30.

In the filter device 11 described above, one parallel arm resonator is provided in each parallel line. However, example embodiments of the present invention are not limited thereto. In the filter device 11, two or more parallel arm resonators may be provided in each parallel line.

Hereinabove, example embodiments of the present invention has been described. In the resonator 51, the piezoelectric substrate 101 has piezoelectricity. The resonant electrode 31 is provided on the piezoelectric substrate 101. The resonant electrode 31 includes the busbar electrodes 73*a* and 73*b* facing each other, the plurality of electrode fingers 72*a* extending in a comb shape from the busbar electrode 73*a* toward the busbar electrode 73*b*, and the plurality of electrode fingers 72*b* extending in a comb shape from the busbar electrode 73*b* toward the busbar electrode 73*a* such that the electrode fingers 72*a* and 72*b* are alternately arranged in the x-axis direction. The comb-shaped electrode 71*a* includes the busbar electrode 73*a* and the plurality of electrode fingers 72*a*. The comb-shaped electrode 71*b* includes the busbar electrode 73*b* and the plurality of electrode fingers 72*b*. The piezoelectric substrate 101 includes the overlap region 21 where the electrode fingers 72*a* and 72*b* overlap when the piezoelectric substrate 101 is viewed in the x-axis direction. The overlap region 21 includes the region 21*a* including a plurality of pairs of the electrode fingers 72*a* and 72*b* alternately arranged in the x-axis direction at the pitch Pa, and the region 21*b* including a plurality of pairs of the electrode fingers 72*a* and 72*b* alternately arranged in the x-axis direction at the pitch Pb different from the pitch Pa. Then, the electrostatic capacitance of the comb-shaped electrodes 71*a* and 71*b* in the region 21*a* is about 0.9 times r more and about 1.1 times or less the electrostatic capacitance of the comb-shaped electrodes 71*a* and 71*b* in the region 21*b*.

The larger the pitch, the higher the resistance to externally supplied power or given charge. As described above, since the overlap region 21 includes the region 21*a* in which the electrode fingers 72*a* and 72*b* are alternately arranged in the x-axis direction at the pitch Pa and the region 21*b* in which the electrode fingers 72*a* and 72*b* are alternately arranged in the x-axis direction at the pitch Pb different from the pitch Pa, the regions have different pitches. Thus, it is possible to estimate the power supplied or charge occurring at the time of destruction on the basis of the destroyed region. Accordingly, it is possible to provide resonator and filter devices that each enable quantitative determination of the cause of destruction from a destroyed resonator. Moreover, since the electrostatic capacitance of the comb-shaped electrodes 71a and 71b in the region 21a is about 0.9 times or more and about 1.1 times or less that of the comb-shaped electrodes 71a and 71b in the region 21b, it is possible to reduce variations in the electrostatic capacitance of the plurality of unit regions 22a and the plurality of unit regions 22b near the boundary between the region 21a and the region 21b. As a result, it is possible to reduce deviations in the phase of surface acoustic waves propagating through the resonator 51, and thus reduce ripples based on the phase deviations.

In the resonator 51, the piezoelectric substrate 101 has piezoelectricity. The resonant electrode 31 is provided on the piezoelectric substrate 101. The resonant electrode 31 includes the busbar electrodes 73a and 73b facing each other, the plurality of electrode fingers 72a extending in a comb shape from the busbar electrode 73a toward the busbar electrode 73b, and the plurality of electrode fingers 72b extending in a comb shape from the busbar electrode 73b toward the busbar electrode 73a such that the electrode fingers 72a and 72b are alternately arranged in the x-axis direction. The comb-shaped electrode 71a includes the busbar electrode 73a and the plurality of electrode fingers 72a. The comb-shaped electrode 71b includes the busbar electrode 73b and the plurality of electrode fingers 72b. The piezoelectric substrate 101 includes the overlap region 21 where the electrode fingers 72a and 72b overlap when the piezoelectric substrate 101 is viewed in the x-axis direction. The overlap region 21 includes the region 21a in which the electrode fingers 72a and 72b are alternately arranged in the x-axis direction at the pitch Pa with the gap Ga and J (J is an integer of two or more) pairs 23a of the electrode fingers 72a and 72b are included, and the region 21b in which the electrode fingers 72a and 72b are alternately arranged in the x-axis direction at the pitch Pb different from the pitch Pa with the gap Gb and K (K is an integer of two or more) pairs 23b of the electrode fingers 72a and 72b are included. Then, the value Va obtained by dividing the pitch Pa by the gap Ga is about 0.9 times or more and about 1.1 times or less the value Vb obtained by dividing the pitch Pb by the gap Gb.

The larger the pitch, the higher the resistance to externally supplied power or given charge. As described above, since the overlap region 21 includes the region 21a in which the electrode fingers 72a and 72b are alternately arranged in the x-axis direction at the pitch Pa and the region 21b in which the electrode fingers 72a and 72b are alternately arranged in the x-axis direction at the pitch Pb different from the pitch Pa, the regions have different pitches. Thus, it is possible to estimate the power supplied or charge occurring at the time of destruction on the basis of the destroyed region. Accordingly, it is possible to provide resonators and filter device that each enable quantitative determination of the cause of destruction from a destroyed resonator. Moreover, since the value Va in the region 21a is about 0.9 times or more and about 1.1 times or less the value Vb in the region 21b, it is possible to set the electrostatic capacitance of the unit region 22a in the region 21a to be substantially about 0.9 times or more and about 1.1 times or less the electrostatic capacitance of the unit region 22b in the region 21b. That is, it is possible to reduce variations in the electrostatic capacitance of the plurality of unit regions 22a and the plurality of unit regions 22b near the boundary between the region 21a and the region 21b. As a result, it is possible to reduce deviations in the phase of surface acoustic waves propagating through the resonator 51, and thus reduce ripples based on the phase deviations.

In the resonator 51, a value obtained by multiplying J by the value Va may be about 0.9 times or more and about 1.1 times or less a value obtained by multiplying K by the value Vb.

With this configuration, it is possible to reduce variations in the electrostatic capacitance of the regions 21a and 21b, and thus effectively reduce deviations in the phase of surface acoustic waves propagating through the resonator 51.

In the resonator 51, J may be about 0.9 times or more and about 1.1 times or less K.

With this configuration, it is possible to easily reduce variations in the electrostatic capacitance in the regions.

In the resonator 51, J and K may be an integer of five or more.

With this configuration, it is possible to increase the region size to some extent, which makes it easier to identify the existence of the regions 21a, 21b and 21c and, in the event of destruction, which of the regions 21a, 21b and 21c has been destroyed.

In the resonator 51, the pitch Pa may be about 0.99 times or more and about 1.01 times or less the pitch Pb.

By thus reducing variations in the pitch, it is possible to avoid deterioration of the Q value of the resonator.

In the filter device 11, the series line S30 connects the input terminal Tin and the output terminal Tout. The parallel lines P41, P42, P43, and P44 branch from the series line S30. The series arm resonators 131, 132, 133, and 134 are provided in the series line S30. The parallel arm resonators 241, 242, 243, and 244 are provided in the parallel lines P41, P42, P43, and P44, respectively. At least one of the series arm resonators and the parallel arm resonators closest to the input terminal Tin or the output terminal Tout is the resonator 51.

With this configuration, the series arm resonator and the parallel arm resonator easily affected by externally supplied power or given charge can be set as the resonator 51 for providing determination, so that sensitivity to incoming power or charge can be increased and the power supplied or charge occurring at the time of destruction can be estimated accurately.

The example embodiments described above are provided to facilitate understanding of the present invention, and are not to be construed as limiting the present invention. Example embodiments of the present invention may be changed/improved without departing from the scope of the present invention, and the present invention also includes equivalents thereof. That is, each example embodiment with appropriate design changes made by those skilled in the art is also included in the scope of the present invention as long as it includes the features and provides the advantageous effects of the present invention. For example, each element and its arrangement, materials, conditions, shape, size, and the like included in each example embodiment are not limited to those shown in the examples and can be changed as necessary. Also, each example embodiment is an example, and partial substitutions or combinations of the configurations shown in the different example embodiments are possible, and these are also included in the scope of the invention as long as they include the features of the invention.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resonator comprising:
a substrate having piezoelectricity; and
a resonant electrode on the substrate, wherein
the resonant electrode includes:
    a first busbar electrode and a second busbar electrode facing each other;
    a plurality of first electrode fingers extending in a comb shape from the first busbar electrode toward the second busbar electrode; and
    a plurality of second electrode fingers extending in a comb shape from the second busbar electrode toward the first busbar electrode such that the plurality of first electrode fingers and the plurality of second electrode fingers are alternately arranged in a first direction;
a first comb-shaped electrode includes the first busbar electrode and the plurality of first electrode fingers;
a second comb-shaped electrode includes the second busbar electrode and the plurality of second electrode fingers;
the substrate includes an overlap region where the plurality of first electrode fingers and the plurality of second electrode fingers overlap when the substrate is viewed in the first direction;
the overlap region includes:
    a first region including a plurality of pairs of the first electrode fingers and the second electrode fingers alternately arranged in the first direction at a first pitch; and
    a second region including a plurality of pairs of the first electrode fingers and the second electrode fingers alternately arranged in the first direction at a second pitch different from the first pitch; and
an electrostatic capacitance of the first comb-shaped electrode and the second comb-shaped electrode in the first region is about 0.9 times or more and about 1.1 times or less an electrostatic capacitance of the first comb-shaped electrode and the second comb-shaped electrode in the second region.

2. The resonator according to claim 1, wherein each of the first region and the second region includes five or more pairs of the first electrode fingers and the second electrode fingers.

3. The resonator according to claim 1, wherein the first pitch is about 0.99 times or more and about 1.01 times or less the second pitch.

4. The resonator according to claim 1, wherein the substrate includes lithium niobate or lithium tantalate.

5. The resonator according to claim 1, wherein each of the plurality of first electrode fingers and the plurality of second electrode fingers has a same or substantially a same width.

6. A filter device comprising:
a series line connecting an input terminal and an output terminal;
at least one parallel line branching from the series line;
one or more series arm resonators provided in the series line; and
at least one parallel arm resonator provided in the at least one parallel line; wherein at least one of series arm resonators and parallel arm resonators closest to the input terminal or the output terminal is the resonator according to claim 1.

7. The filter device according to claim 6, wherein each of the first region and the second region includes five or more pairs of the first electrode fingers and the second electrode fingers.

8. The filter device according to claim 6, wherein the first pitch is about 0.99 times or more and about 1.01 times or less the second pitch.

9. The filter device according to claim 6, wherein the substrate includes lithium niobate or lithium tantalate.

10. The filter device according to claim 6, wherein each of the plurality of first electrode fingers and the plurality of second electrode fingers has a same or substantially a same width.

11. A resonator comprising:
a substrate having piezoelectricity; and
a resonant electrode on the substrate; wherein
the resonant electrode includes:
    a first busbar electrode and a second busbar electrode facing each other;
    a plurality of first electrode fingers extending in a comb shape from the first busbar electrode toward the second busbar electrode; and
    a plurality of second electrode fingers extending in a comb shape from the second busbar electrode toward the first busbar electrode such that the first electrode fingers and the second electrode fingers are alternately arranged in a first direction;
a first comb-shaped electrode includes the first busbar electrode and the plurality of first electrode fingers;
a second comb-shaped electrode includes the second busbar electrode and the plurality of second electrode fingers;
the substrate includes an overlap region where the first electrode fingers and the second electrode fingers overlap when the substrate is viewed in the first direction;
the overlap region includes:
    a first region including J pairs of the first electrode fingers and the second electrode fingers alternately arranged in the first direction at a first pitch with a first gap where J is an integer of two or more; and
    a second region including K pairs of the first electrode fingers and the second electrode fingers alternately arranged in the first direction at a second pitch different from the first pitch with a second gap where K is an integer of two or more;
a first value obtained by dividing the first pitch by the first gap is about 0.9 times or more and about 1.1 times or less a second value obtained by dividing the second pitch by the second gap; and
a value obtained by multiplying the J by the first value is about 0.9 times or more and about 1.1 times or less a value obtained by multiplying the K by the second value.

12. The resonator according to claim 11, wherein the J and the K are integers of five or more.

13. The resonator according to claim 11, wherein the first pitch is about 0.99 times or more and about 1.01 times or less the second pitch.

14. A filter device comprising:
a series line connecting an input terminal and an output terminal;
at least one parallel line branching from the series line;
at least one series arm resonator provided in the series line; and
at least one parallel arm resonator provided in the at least one parallel lines; wherein at least one of the at least one series arm resonator and the at least one parallel arm resonator closest to the input terminal or the output terminal is the resonator according to claim 11.

15. The filter device according to claim 14, wherein the J is about 0.9 times or more and about 1.1 times or less the K.

16. The filter device according to claim 14, wherein the J and the K are integers of five or more.

17. The filter device according to claim 14, wherein the first pitch is about 0.99 times or more and about 1.01 times or less the second pitch.

18. A resonator comprising:

a substrate having piezoelectricity; and a resonant electrode on the substrate; wherein the resonant electrode includes:

a first busbar electrode and a second busbar electrode facing each other;

a plurality of first electrode fingers extending in a comb shape from the first busbar electrode toward the second busbar electrode; and a plurality of second electrode fingers extending in a comb shape from the second busbar electrode toward the first busbar electrode such that the first electrode fingers and the second electrode fingers are alternately arranged in a first direction;

a first comb-shaped electrode includes the first busbar electrode and the plurality of first electrode fingers;

a second comb-shaped electrode includes the second busbar electrode and the plurality of second electrode fingers;

the substrate includes an overlap region where the first electrode fingers and the second electrode fingers overlap when the substrate is viewed in the first direction;

the overlap region includes:

a first region including J pairs of the first electrode fingers and the second electrode fingers alternately arranged in the first direction at a first pitch with a first gap where J is an integer of two or more; and a second region including K pairs of the first electrode fingers and the second electrode fingers alternately arranged in the first direction at a second pitch different from the first pitch with a second gap where K is an integer of two or more;

a first value obtained by dividing the first pitch by the first gap is about 0.9 times or more and about 1.1 times or less a second value obtained by dividing the second pitch by the second gap; and the J is about 0.9 times or more and about 1.1 times or less the K.

19. The resonator according to claim 18, wherein the J and the K are integers of five or more.

20. The resonator according to claim 18, wherein the first pitch is about 0.99 times or more and about 1.01 times or less the second pitch.

* * * * *